United States Patent [19]

Murao et al.

[11] Patent Number: 4,950,360

[45] Date of Patent: Aug. 21, 1990

[54] METHOD OF TREATING THE SURFACE OF A MOLDED ARTICLE COMPRISING LIQUID CRYSTAL POLYESTER RESIN

[75] Inventors: Toshiro Murao, Fuji; Yoshiharu Suzuki, Shizuoka; Mitsuo Wada, Fuji; Hiroaki Konuma, Shimizu, all of Japan

[73] Assignee: Polyplastics Co., Ltd., Japan

[21] Appl. No.: 249,691

[22] Filed: Sep. 27, 1988

[30] Foreign Application Priority Data

Oct. 9, 1987 [JP] Japan ................... 62-255915

[51] Int. Cl.$^5$ .............................................. B05D 3/10
[52] U.S. Cl. ........................................ 156/668; 156/625; 204/30; 204/32.1; 427/307; 427/444
[58] Field of Search ................. 156/668, 625; 204/29, 204/30, 32.1, 44, 52.1; 427/307, 444

[56] References Cited

U.S. PATENT DOCUMENTS

| | | | |
|---|---|---|---|
| 3,266,963 | 8/1966 | Stearns | 156/642 |
| 4,067,852 | 1/1978 | Calundann | 528/140 |
| 4,418,162 | 11/1983 | Kasuga et al. | 524/542 |
| 4,579,882 | 4/1986 | Kanbe et al. | 523/137 |
| 4,626,371 | 12/1986 | Ikenaga, et al. | 252/62.54 |

Primary Examiner—David L. Lacey
Assistant Examiner—Todd J. Burns
Attorney, Agent, or Firm—Burns, Doane, Swecker & Mathis

[57] ABSTRACT

Three dimensional molded articles comprising liquid crystalline polyesters are recognized to be extremely difficult to finish such as by printing, painting, metallizing, plating, etc. An effective answer to this difficulty is provided by initially blending within the liquid crystalline polyester at least one particulate inorganic filler selected from the group consisting of Group II elements of the periodic table and oxides, sulfates, phosphates, silicates, and carbonates thereof, and elements of aluminum, silicon, tin, lead, antimony, and bismuth and oxides thereof, in an amount of 5 to 80 percent by weight; forming a molded article from the same; and contacting the resulting molded article with an acidic solution containing at least 80 percent by weight of sulfuric acid. The requisite surface modification for finishing to form a quality product is made possible.

9 Claims, No Drawings

METHOD OF TREATING THE SURFACE OF A MOLDED ARTICLE COMPRISING LIQUID CRYSTAL POLYESTER RESIN

This invention relates to a method of treating the surface of a molded article comprising a melt-processable polyester resin capable of forming an anisotropic melt phase (hereinafter simply abbreviated to "liquid crystal polyester").

More particularly, the present invention is concerned with a method of a surface treatment for efficiently preparing a molded article comprising a liquid crystal polyester resin excellent in heat resistance and fabricability and having surface characteristic adapted to surface decoration by printing, painting, vacuum deposition, plating, etc. and bonding with an adhesive.

PRIOR ART

As opposed to generally known thermoplastic polyesters, e.g., polybutylene terephthalate and polyethylene terephthalate, a liquid crystal polyester comprises a rigid polymer and retains its rodlike shape even when it is in a molten state because its molecular chain is difficult to bend. Therefore, such a polyester not only exhibits a lesser tendency toward entanglement of the molecules in a molten state but also causes unidirectional orientation when a small shear stress is applied thereto and therefore exhibits a crystallinity even in a liquid state, i.e., the so-called liquid crystallinity.

It is possible to apply generally employed injection molding to the above-described liquid crystal polyester. However, since the surface of the resulting molding is highly oriented, the surface layer portion tends to be peeled off and fluffed, which makes it impossible to conduct the fabrication of the molding as such through bonding, painting, or plating. Although the surface roughening treatment with a chemical which is a usual practice with general resins is considered to be effective. However, since the surface is chemically very inert, there exists no suitable solvent having an affinity for the surface. This makes it impossible to remove the oriented surface layer for roughening of the surface.

Meanwhile, the liquid crystal polyester has excellent thermal properties such as a low coefficient of linear expansion comparable to that of general metals and excellent heat resistance enough to withstand immersion in a solder bath of 260° C. for 10 sec without causing any abnormal change. Therefore, it has been demanded to develop a method of a surface treatment which enables the improvement in the above-described surface characteristics for the purpose of using it for parts to be bonded to a metal with an adhesive and plated substrates by taking advantage of the above-described properties. However, no satisfactory method has yet been proposed.

SUMMARY OF THE INVENTION

The present inventors have made extensive and intensive studies with a view to developing a method of surface treatment which not only enables the surface to be chemically activated without spoiling the physical and chemical properties by taking advantage of the above-described thermally useful characteristics of the liquid crystal polyester but also prevents the formation of a surface layer which tends to be peeled off. As a result, the present inventors have found that the surface fabricability of the molded article comprising a liquid crystal polyester resin can remarkably be improved by bringing a molded article comprising a liquid crystal polyester and 5 to 80% (based on the total amount of the composition) of a particular inorganic filler incorporated therein into contact with an etching solution comprising an acidic solution containing at least 80% by weight of sulfuric acid for treatment of the molded article, i.e., by the adoption of a combination of a particular material composition with a particular etching solution, which has led to the completion of the present invention.

The inorganic filler used in the present invention is at least one member selected from the group consisting of the Group II elements of the periodic table and oxides, sulfates, phosphates, silicates, and carbonates thereof, and elements of aluminum, silicon, tin, lead, antimony, and bismuth and oxides thereof.

With respect to the Group II elements of the periodic table, examples of the oxides include compounds such as magnesium oxide, calcium oxide, barium oxide, and zinc oxide, examples of the phosphates include compounds such as magnesium phosphate, calcium phosphate, barium phosphate, zinc phosphate, magnesium pyrophosphate, and calcium pyrophosphate, examples of the sulfates include magnesium sulfate, calcium sulfate, and barium sulfate, examples of the silicates include magnesium silicate, calcium silicate, aluminum silicate, kaolin, talc, clay, diatomaceous earth, and wollastonite, and examples of the carbonates include calcium carbonate, magnesium carbonate, barium carbonate, and zinc carbonate.

These inorganic fillers are preferably used particularly for surface treatment for the purpose of conducting plating or the like in the fabrication process. The phosphates are particularly preferable. When painting or the like is conducted in the fabrication process, the inorganic filler used in the surface treatment may preferably be at least one member selected from the group consisting of the above-described inorganic fillers and further amphoteric metallic elements such as aluminum, silicon, tin, lead, antimony, and bismuth and oxides thereof.

The amount of incorporation of these inorganic fillers is 5 to 80% by weight, preferably 20 to 70% by weight based on the total amount of the liquid crystal polyester resin composition. When the amount is less than 5% by weight, not only there occur nonuniform flow marks on the surface of the molded article but also the surface layer of the molded article is easily peeled off as a thin skin when an adhesive tape is applied to the surface of the molded article and then peeled off. Further, nonuniform etching is caused in the surface treated molded article. On the other hand, when the amount exceeds 80% by weight, the flowability of the resin is lowered, which makes it impossible to form a molded article having excellent surface characteristics. This unfavorably brings about a roughened surface in the etching process as well as a lowering in the mechanical strengths. The particle diameter of the inorganic filler is preferably 0.01 to 100 $\mu$m, preferably 0.1 to 30 $\mu$m, more preferably 0.5 to 10 $\mu$m in terms of the average particle diameter. When the particle diameter is less than 0.01 $\mu$m, agglomerates tend to be formed on the surface of the molded article due to poor dispersion. On the other hand, when the particle diameter exceeds 100 $\mu$m, the degree of roughness of the surface is increased, which makes it impossible to obtain a good appearance.

The above-described inorganic filler may be incorporated in the liquid crystal polyester by various methods. However, it is preferred to uniformly knead and disperse the inorganic filler prior to molding through melt kneading with an extruder.

The etching solution used in the present invention, i.e., an acidic solution containing at least 80% by weight of sulfuric acid, is an aqueous solution comprising sulfuric acid alone or a mixed aqueous solution comprising a combination of sulfuric acid with at least one member selected from among aqueous solutions of dichromic acid, chromic anhydride, phosphoric acid, p-toluenesulfonic acid, pyrophosphoric acid, potassium permanganate, etc. In the etching of the molded article comprising a liquid crystal polyester with the above-described acidic solution, the optimal conditions of the immersion in the etching solution are properly investigated and selected depending upon the composition of the etching solution In general, the treatment is conducted by making use of an aqueous sulfuric acid solution having a concentration of 80 to 98% by weight at 40 to 80° C. for 3 to 120 min, preferably by making use of an aqueous sulfuric acid solution having a concentration of 90 to 98% by weight at 60 to 70° C. for 10 to 30 min, particularly preferably by making use of an aqueous sulfuric acid solution having a concentration of 95% by weight at 60° C. for 30 min.

In the present invention, the liquid crystal polyester is a melt-processable polyester and has properties such that the molecular chains are regularly arranged parallel to each other in a molten state. The state in which molecules are arranged in this way is often called a liquid crystal state or a nematic phase of a liquid crystal material. Such polymer molecules are generally comprised of polymers which are slender and flat and have considerably high rigidity along the major axis of the molecules and a plurality of chain-extending bonds which are usually in either a coaxial relationship or a parallel relationship with each other.

The properties of the anisotropic molten phase may be examined by a customary polariscopic method using crossed nicols. More particularly, the anisotropic melt phase can be examined by observing a melt sample placed on a Leitz hot stage in a nitrogen atmosphere at a magnification of 40 under a Leitz polarization microscope. The above-mentioned polymer is optically anisotropic. Namely, when it is placed between crossed nicols, it transmits light. If the sample is optically anisotropic, the polarized light will be transmitted, even when it is in a static state.

The components of the polymer which forms the anisotropic melt phase as described above are those selected from the group consisting of:

① at least one member selected from the group consisting of aromatic dicarboxylic acids and alicyclic dicarboxylic acids;

② at least one member selected from the group consisting of aromatic diols, alicyclic diols, and aliphatic diols;

③ at least one member selected from the group consisting of aromatic hydroxy carboxylic acids;

④ at least one member selected from the group consisting of aromatic thiolcarboxylic acids;

5 at least one member selected from the group consisting of aromatic dithiols and aromatic thiol phenols; and ⑥ at least one member selected from the group consisting of aromatic hydroxy amines and aromatic diamines. The polymer which forms the anisotropic melt phase is a polyester capable of forming an anisotropic melt phase and comprised of a combination of components such as:

(I) a polyester comprised of the components ① and ②;
(II) a polyester comprised of only the component ③;
(III) a polyester comprised of the components ①, ②, and ③;
(IV) a polythiol-ester comprised of only the component ④;
(V) a polythiol-ester comprised of the components ① and ⑤;
(VI) a polythiol-ester comprised of the components ①, ④, and ⑤;
(VII) a polyester-amide comprised of the components ①, ③, and 6 .
(VIII) a polyester-amide comprised of the components ①, ②, ③, and ⑥.

Aromatic polyazomethines are also a polymer which forms an anisotropic melt phase, although they are not included in the category of the above-mentioned combinations of components. Particular examples of such aromatic polyazomethines include poly(nitrilo-2-methyl-1,4-phenylenenitriloethylidyne-1,4-phenyleneethylidyne); poly(nitrilo-2-methyl-1,4-phenylenenitrilomethylidyne-1,4-phenylenemethylidyne; and poly(nitrilo-2-chloro-1,4-phenylenenitrilomethylidyne-1,4-phenylenemethylidyne).

Further, polyester carbonates are also a polymer which forms an anisotropic melt phase, although they are not included in the category of the above-mentioned combinations of components. They are comprised essentially of 4-oxybenzoyl, dioxyphenyl, dioxycarbonyl, and terephthaloyl units.

The above-described polyesters (I), (II), and (III) and polyester amide (VIII) which are polymers capable of forming an anisotropic melt phase suitable for use in the present invention may be produced by various esterification processes in which organic monomer compounds having functional groups capable of forming required repetitive units through condensation are mutually reacted. Examples of the functional groups of these organic monomer compounds include carboxyl, hydroxyl, ester, acyloxy, acyl halide, and amino groups. The organic monomer compounds can be reacted by a melt acidolysis method in the absence of any heat exchange fluid. According to this method, the monomers are first heated together to form a melt of reactants. As the reaction proceeds, solid polymer particles are suspended in the melt. Vacuum may be applied in order to facilitate the removal of volatile matter (e.g., acetic acid or water) which is produced as a by-product in the final stage of the condensation.

Further, a slurry condensation method may also be adopted in forming a liquid crystal aromatic polyester suitable for use in the present invention. In this method, the solid product is obtained as a suspension in a heat exchange medium.

The liquid crystal polymers suitable for use in the present invention tend to be substantially insoluble in usual solvents, which renders them unsuitable for use in solution processing. However, as mentioned above, these polymers may be readily processed by ordinary melt processing.

The liquid crystal polyester suitable for use in the present invention have a weight-average molecular weight of about 2,000 to 200,000, preferably about 10,000 to 50,000, and particularly preferably about 20,000 to 25,000. On the other hand, the wholly aromatic polyester-amide suitable for the present invention has a molecular weight of about 5,000 to 50,000, preferably about 10,000 to 30,000, e.g., 15,000 to 17,000. the molecular weight may be determined by gel permeation chromatography and other standard determination methods which do not involve the formation of a solution of polymers, e.g., by determining the terminal groups by infrared spectroscopy in the form of a compression-molded film. Alternatively, the molecular weight may be determined by a light scattering method in the form of a pentafluorophenol solution.

Polyesters which form an anisotropic melt phase suitable for use in the present invention are aromatic polyesters and aromatic polyester-amides and may also include polyesters which partially contain aromatic polyester units and aromatic polyester-amide units in the same molecular chain.

Examples of the compounds constituting the above-mentioned polymers include naphthalene compounds such as 2,6-naphtalenedicarboxylic acid, 2,6-dihydroxynaphthalene, 1,4-dihydroxynaphthalene, and 6-hydroxy-2-naphthoic acid, biphenyl compounds such as 4,4'-biphenyldicarboxylic acid and 4,4'-dihydroxybiphenyl, compounds represented by the following general formulae (I), (II), or (III):

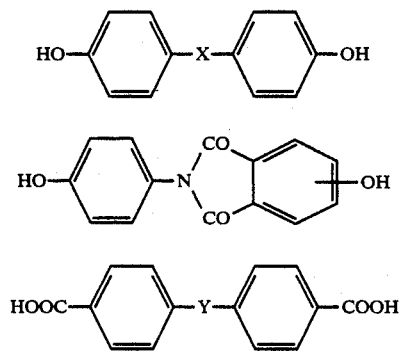

wherein X is a group selected from among an alkylene group (having 1 to 4 carbon atoms), an alkylidene group, —O—, —SO—, —SO$_2$—, —S—, and —CO—; and Y is a group selected from among —(CH$_2$)$_n$— (wherein n is 1 to 4) and —O(CH$_2$)$_n$O— (wherein n is 1 to 4); parasubstituted benzene compounds such as p-hydroxybenzoic acid, terephthalic acid, hydroquinone, p-aminophenol, and p-phenylenediamine and nucleus-substituted compounds thereof (wherein the substituent is selected from among chlorine, bromine, methyl, phenyl, and 1-phenylethyl); and meta-substituted benzene compounds such as isophthalic acid and resorcinol.

Further, the liquid crystal polyester which is used in the present invention may be a polyester partially containing a polyalkylene terephthalate portion which does not exhibit any anisotropic melt phase in the same molecular chain besides the above-described components. In this case, the alkyl group has 2 to 4 carbon atoms.

Among the polymers comprised of the abovedescribed components, polymers containing at least one member selected from among naphthalene compounds, biphenyl compounds, and para-substituted benzene compounds as essential component are more preferable. Particularly preferable para-substituted benzene compounds include p-hydrobenzoic acid, methylhydroquinone, and 1-phenylethylhydroquinone.

Polyesters capable of forming an anisotropic melt phase which are particularly preferably used in the present invention are those containing at least about 10 mol% of repetitive units containing a naphthalene portion such as 6-hydroxy-2-naphthoyl, 2,6-dihydroxynaphthalene, and 2,6-dicarboxynaphthalene. preferred polyester-amides are those containing repetitive units containing the above-mentioned naphthalene portion and a portion comprised of 4-aminophenol or 1,4-phenylenediamine.

Specific examples of the compounds which are components in the above-mentioned polymers (I) to (VIII) and specific examples of polyesters capable of forming an anisotropic melt phase and suitable for use in the present invention are described in Japanese Pat. Laid-Open No. 69866/1986.

Further, in the present invention, various auxiliary inorganic materials besides the above-described particular inorganic fillers may also be blended in order to improve various characteristics. It is preferred that the auxiliary inorganic material be blended in order to prepare a molded article having excellent mechanical properties, thermal resistance, dimensional stability (resistance to deformation and warping), electrical properties, etc. The auxiliary inorganic material is used in the form of fiber, particle, and sheet depending upon the purposes.

Examples of the fibrous inorganic material include fibrous inorganic materials such as glass fiber, carbon fiber, asbestos fiber, silica fiber, silica-alumina fiber, alumina fiber, zirconia fiber, boron nitride fiber, silicon nitride fiber, boron fiber, potassium titanate fiber, and fibers of metals such as stainless steel, aluminum, titanium, copper, and brass.

Examples of the particulate inorganic material include carbon black, graphite, silica, quartz powder, glass bead, milled glass fiber, glass balloon, glass powder, metallic oxides such as iron oxide, antimony trioxide, and alumina, and other inorganic materials such as ferrite, silicon carbide, silicon nitride, and boron nitride.

Examples of the flaky inorganic material include mica, glass flake, and various metallic foils.

These auxiliary inorganic materials may be used alone or in any combination of two or more of them.

The auxiliary inorganic material is preferably a fibrous inorganic material, particularly preferably glass fiber. The amount of the auxiliary inorganic material is 1 to 60% by weight, preferably 5 to 40% by weight based on the total weight of the molded article composition. However, it is unfavorable for the total amount of blending of the above-described inorganic filler and the auxiliary inorganic material to exceed 85% by weight based on the molded article composition from the standpoint of the fabricability and various physical properties. Further, the filling of a fibrous inorganic material alone brings about a slight increase in the surface roughness, which renders the molded article unsuitable for the application of plating for decoration. It has been found that a combination of an auxiliary fibrous inorganic material having a diameter of 1 to 30 μm and a length of 5 μm to 1 mm, preferably 10 μm to 100 μm, particularly glass fiber, with the above-described inorganic filler unexpectedly brings about a further improvement in the evenness of the surface of the molded article and contributes to an improvement in the adhesion of plating provided for the purpose of forming a conductive circuit on the molded article. A milled glass fiber having properties between glass fiber and finely divided glass is particularly preferred from the standpoint of balance between the surface roughness and the mechanical properties of the material.

When these inorganic fillers and auxiliary inorganic materials are used, it is preferred that, if necessary, binders and surface treatments be used.

In the present invention, combined use of a nucleating agent which has been used in the prior art has no adverse effect on the composition of the present invention.

Further, the composition of the present invention may contain other thermoplastic resins as an auxiliary additive in such an amount as will not spoil the purpose of the present invention.

The thermoplastic resins used in this case are not particularly limited. Examples of the thermoplastic resins include polyolefins such as polyethylene and polypropylene, polyacetal (homopolymer or copolymer), polystyrene, polyvinyl chloride, and polyacrylate and their copolymers, polyamide, polycarbonate, ABS, polyoxyphenylene oxide, polyoxyphenylene sulfide, and fluorocarbon resin. These thermoplastic resins may be used in the form of a mixture of two or more of them.

Further, known substances which are added to ordinary thermoplastic or thermosetting resins, i.e., plasticizers, stabilizers such as antioxidants and ultraviolet absorbers, antistatic agents, surface treatments, surfactants, flame retardants, colorants such as dyes and pigments, lubricants and lubricating agents for improving flowability and releasability, and crystallization accelerator (nucleating agent), may also be used according to the intended characteristics.

Further, in the present invention, it is possible to treat the molded article before, after, or simultaneously with the etching process by an ordinary method. Examples of the treatment include a heat treatment, a hot water treatment, or immersion in a solution containing a particular compound before or after the etching process. The treatment after etching may be conducted together with the steps of neutralization of the etching solution, washing, drying, etc.

EFFECT OF THE INVENTION

As described above, the method of treating the surface of a molded article comprising a liquid crystal polyester resin causes no peeling of the surface layer of the resin, enables the formation of a uniform and dense surface structure, improves the adhesion to a coating, an adhesive, and plating, provides a solution to the problem of occurrence of high-temperature peeling due to the difference in the coefficient of thermal expansion between the resin and the metal which could not be solved by general thermoplastic resins, and enables immersion in a solder (treatment time: about 10 sec). This in turn enabled the use of the molded article for not only exterior parts but also applications associated with printed circuit boards.

EXAMPLES

The treatment method according to the present invention will now be described in more detail with reference to the following Examples and Comparative Examples that should not be construed as limiting the scope of the present invention.

EXAMPLES 1 to 8 and COMPARATIVE EXAMPLES 1 to 4

A liquid crystal polyester resin A which will be described later and a filler shown in Table 1 were kneaded and dispersed in each other by melt kneading with an extruder, followed by pelletization. The pellets thus formed were dried at 140° C. for 3 hr and molded into a specimen with a mold kept at 150 to 160° C. The molded flat sheet was subjected to tests on various surface characteristics by the following method. The results are shown in Table 1.

(1) Peelability of the surface derived from surface orientation:

A cellophane adhesive tape (a width of 18 mm; a product of Nichiban Co., Ltd.) was applied on the molded flat sheet and pressed by fingers (about 500 g). Then, the tape was peeled off at an angle of 90° to evaluate the peelability of the surface layer by visual inspection.

Evaluation:
- ⊚ ... no surface peeling occurred.
- ○ ... surface peeling hardly occurred.
- △ ... surface peeling partly occurred.
- x ... surface layer adhered to substantially the whole surface of the tape and the surface peeling occurred.

(2) Degree of flow marks or nonuniform flow:

The surface of the molded article was evaluated by visual inspection.

Evaluation:
- ⊚ ... surface was uniform.
- ○ ... surface was substantially uniform.
- △ ... flow marks partly occurred.
- x ... flow marks occurred over the whole surface.

(3) Variation in surface roughness accompanying etching treatment:

A molded article was sufficiently degreased through immersion in an alkaline degreasing solution (Ace Creen A220; a product of Okuno Chemical Industries Co., Ltd.) at 60° C. for 5 min and washed with water, followed by etching in a 98 wt% sulfuric acid solution at 60° C. for 20 min. The etched molded article was washed with water, immersed in a 5 wt% solution of sodium hydroxide at room temperature for 3 min to neutralize the acid component attached to the surface thereof, and dried at 80° C. for 15 min in a hot air circulation oven. In order to examine the roughness of the surface of the molded article which had been subjected to the etching pre-treatment, the maximum roughness was measured in three places on the etched surface with a surface roughness meter (Surfcorder SE3C; a product of Kosaka Laboratory Ltd.)

(4) Adhesion of molded article having treated surface:

A molded ASTM tensile specimen was subjected to an etching treatment in the same manner as that of the above item (3). Then, an epoxy adhesive (Cemedine EP-007; two-pack adhesive) was applied to each top portion of two parts of the dumbbell test piece divided at the center thereof (length of overlapped portion: 1 cm) and the two portions were stuck to each other. The specimen was allowed to stand at room temperature for 24 hr to measure the tensile load with a universal testing machine. The shear strength per $cm^2$ was determined from the tensile load value and expressed as the tensile shear strength.

(5) Bonding strength of plating of molded article having treated surface:

An etched flat sheet (50×70×3 mm) was plated by the following method. A cut in the form of a belt having a width of 1 cm was made with a cutter, and the top portion was turned up at an angle of 90°. Then, the top portion was grasped with a spring balance to measure the force required for peeling off the plating. The force was expressed as the bonding strength of plating (kg/cm).

<Method of plating>

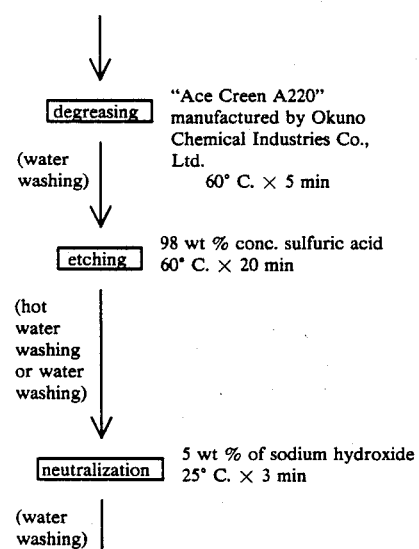

molded article
↓
degreasing — "Ace Creen A220" manufactured by Okuno Chemical Industries Co., Ltd. 60° C. × 5 min
(water washing)
↓
etching — 98 wt % conc. sulfuric acid 60° C. × 20 min
(hot water washing or water washing)
↓
neutralization — 5 wt % of sodium hydroxide 25° C. × 3 min
(water washing)
↓

-continued
<Method of plating> wetting — 1 wt % of wetting agent (Dustar AL-1: a product of Miyoshi Oil & Fat Co., Ltd.) 25° C. × 1 min
(water washing)
↓
catalyst — [A-30 (a product of Okuno Chemical Industries Co., Ltd.)/36% hydrochloric acid/water = 1:1:5)] 25° C. × 2 min
(water washing)
↓
accelerator — 5 wt % of hydrochloric acid 25° C. × 2 min
(dilute sulfuric acid)
↓
electroless copper plating — (a product of Okuno Chemical Industries Co., Ltd.; 100 ml/l of solution A, 100 ml/ml of solution B, 2 ml/l of solution C)
(dilute sulfuric acid)
↓
electro-copper plating — (thickness: 40 μm)

TABLE 1

| Ex. and Comp. Ex. No. | composition | | | evaluation | | | | |
|---|---|---|---|---|---|---|---|---|
| | liquid crystal polyester A (wt %) | inorganic filler | auxiliary inorganic material | (1) peelability of surface | (2) evenness of surface | (3) roughness of etched surface ($R_{max}$; μm) | (4) adhesion after etching (kg/cm²) | (5) bonding strength of plating after etching (kg/cm) |
| Ex. 1 | 50 | calcium pyrophosphate (particle diameter: 0.5 μm) 50 wt % | — | ◎ | ◎ | 7~8 | 140 | 1.5 |
| 2 | 50 | calcium pyrophosphate (particle diameter: 0.5 μm) 35 wt % | milled fiber 15 wt % | ◎ | ◎ | 15~20 | 155 | 1.8 |
| 3 | 85 | barium sulfate (particle diameter: 1 μm) 15 wt % | — | ○ | ○ | 5~7 | 124 | 1.1 |
| 4 | 35 | calcium pyrophosphate (particle diameter: 0.5 μm) 65 wt % | — | ◎ | ◎ | 20~25 | 128 | 1.3 |
| 5 | 50 | barium sulfate (particle diameter: 1 μm) 50 wt % | — | ◎ | ◎ | 15~20 | 132 | 1.5 |
| 6 | 50 | barium sulfate (particle diameter: 1 μm) | glass fiber 15 wt % | ◎ | ◎ | 25~35 | 152 | 1.7 |
| 7 | 50 | barium carbonate (particle diameter: 2 μm) 50 wt % | — | | ◎ | 18~25 | 134 | 1.4 |
| 8 | 50 | zinc oxide (particle diameter: 0.5 μm) 50 wt % | — | ◎ | ◎ | 10~15 | 128 | 1.3 |
| Comp. Ex. 1 | 100 | — | — | x | ◎ | 4~5 | 28 | 0.2 |
| 2 | 97 | calcium pyrophosphate 3 wt % | — | Δ | x | 10~15 | 56 | 0.5 |
| 3 | 70 | — | glass fiber 30 wt % | ◎ | Δ | 35~45 | 98 | 0.7 |
| 4 | 50 | — | glass beads (particle diameter: 50 μm) 50 wt % | ◎ | ◎ | 25~35 | 96 | 0.6 |

EXAMPLES 9 to 13

Flat sheets were molded in the same manner as that of Example 2, except that liquid crystal polyesters B to F were used instead of liquid crystal polyester A to conduct evaluation in the same manner as that of Example 2. The results are shown in Table 2.

TABLE 2

| Ex. No. | base polymer | (1) peelability of surface | (2) evenness of surface | (3) roughness of etched surface ($R_{max}$; μm) | (4) adhesion after etching (kg/cm$^2$) | (5) bonding strength of plating after etching (kg/cm) |
|---|---|---|---|---|---|---|
| 9  | liquid polyester B | ◎ | ◎ | 18~23 | 141 | 1.7 |
| 10 | liquid polyester C | ◎ | ◎ | 15~20 | 148 | 1.5 |
| 11 | liquid polyester D | ◎ | ◎ | 15~20 | 145 | 1.5 |
| 12 | liquid polyester E | ◎ | ◎ | 20~25 | 138 | 1.6 |
| 13 | liquid polyester F | ◎ | ◎ | 12~16 | 130 | 1.4 |

EXAMPLES 14 to 17 and COMPARATIVE EXAMPLES 5 to 8

The material used in Example 4 was molded into flat sheets each having a size of 50×70×3 mm. The flat sheets were etched with various etching solutions to evaluate the surface characteristics. The results are shown in Table 3.

EXAMPLE 18

The plated portion of the plated article obtained in Example 15 was cut in the form of a belt having a width of 10 mm and immersed in a solder bath at 260° C. for 10 sec to evaluate the bonding strength of the plating As a result, it was found that the bonding strength was 1.5 kg/cm, i.e., little or no lowering in the bonding strength was caused.

EXAMPLES 19 to 22 and COMPARATIVE EXAMPLES 9 to 10

Liquid crystal polyester resin A and a filler shown in Table 4 were pelletized in the same manner as that of Example 1 and molded into specimens. With respect to the specimens, the peelability of the surface layer was evaluated in the same manner as that of Example 1, and other tests were conducted by the following method. The results are shown in Table 4.

(6) Strength of material:
The tensile strength of the molded specimen was measured according to ASTM D 638.

(7) Coatability of molded article having treated surface:
A molded article was etched in the same manner as that of the above item (3). The etched molded article was coated with a commercially available urethane coating (Retan PG60; a product of Kansai Paint Co., Ltd.) so as to have a thickness of 30 μm ±10 μm in terms of a dry coating film thickness, followed by drying at 100° C. for 60 min. The dried sample was allowed to stand at room temperature for 1 day, and the bonding strength of the coating film was evaluated by peeling with a checkerboard-shaped cellophane adhesive tape.

TABLE 3

| Ex. and Comp. Ex. No. | composition of etching solution main component | accessory component | etching conditions temp. (°C.) | time (min) | (3) roughness of etched surface ($R_{max}$; μm) | (4) adhesion after etching (kg/cm$^2$) | (5) bonding strength of plating after etching (kg/cm) |
|---|---|---|---|---|---|---|---|
| Ex. 14 | 80 wt % H$_2$SO$_4$ | — | 80 | 45 | 10~14 | 141 | 1.4 |
| 15 | 98 wt % H$_2$SO$_4$ | — | 60 | 20 | 15~20 | 155 | 1.5 |
| 16 | 80 wt % H$_2$SO$_4$ | 10 wt % H$_3$PO$_4$ | 60 | 20 | 8~12 | 140 | 1.7 |
| 17 | 90 wt % H$_2$SO$_4$ | 3 wt % Cr$_2$O$_3$ | 60 | 20 | 6~10 | 136 | 1.9 |
| Comp. Ex. 5 | 75 wt % H$_2$SO$_4$ | — | 80 | 60 | 2~3 | 20 | 0.2 |
| 6 | 36 wt % HCl | — | 30 | 120 | 1~2 | 18 | impossible to plate |
| 7 | 85 wt % H$_3$PO$_4$ | — | 80 | 60 | 3~4 | 32 | impossible to plate |
| 8 | conc. nitric acid | — | 30 | 120 | 2~3 | 48 | 0.3 |

The size of the cross of the checkerboard was 1 mm square ×100 crosses. The results of the evaluation was expressed in terms of the number of remaining crosses of the checkerboard/the total number of the crosses of the checkerboard.

TABLE 4

| Ex. and Comp. Ex. No. | composition liquid crystal polyester A (wt %) | inorganic filler | auxiliary inorganic material | (1) peelability of surface | (6) strength of material (kg/cm$^2$) | (7) coatability after etching |
|---|---|---|---|---|---|---|
| Ex. 19 | 70 | calcium pyrophosphate 30 wt % | — | ○ | 1050 | 100/100 |
| 20 | 50 | calcium pyrophosphate 30 wt % | glass fiber 15 wt % | ◎ | 1120 | 100/100 |
| 21 | 70 | zinc oxide | — | ○ | 1020 | 100/100 |

TABLE 4-continued

| Ex. and Comp. Ex. No. | composition | | | evaluation | | |
|---|---|---|---|---|---|---|
| | liquid crystal polyester A (wt %) | inorganic filler | auxiliary inorganic material | (1) peelability of surface | (6) strength of material (kg/cm²) | (7) coatability after etching |
| 22 | 70 | 30 wt % aluminum oxide | — | ○ | 970 | 100/100 |
| Comp. Ex. 9 | 50 | 30 wt % titanium oxide | — | △ | 670 | 80/100 |
| 10 | 100 | 30 wt % — | — | x | 1600 | 60/100 |

COMPARATIVE EXAMPLES 11 and 12

The same materials as those of Example 2 were evaluated in the same manner as that of Example 2, except that polybutylene terephthalate (PBT) ("Duranex"; a product of Polyplastics Co., Ltd.) was used as an ordinary thermoplastic polyester exhibiting no liquid crystallinity. PBT containing no filler was also evaluated as Comparative Example 12. The results are shown in Table 5.

TABLE 5

| Comp. Ex. No. | composition | | | evaluation | | | | | |
|---|---|---|---|---|---|---|---|---|---|
| | PBT (wt %) | inorganic filler | auxiliary inorganic material | (1) peelability of surface | (2) evenness of surface | (3) roughness of etched surface ($R_{max}$; μm) | (4) adhesion after etching (kg/cm²) | (5) bonding strength of plating after etching (kg/cm) | (7) coatability after etching |
| 11 | 50 | calcium pyrophosphate (particle diameter: 0.5 μm) 35 wt % | milled fiber 15 wt % | ◎ | ◎ | 20~30 | 42 | 0.8 | 100/100 |
| 12 | 100 | — | — | ◎ | ◎ | 4~5 | 30 | 0.5 | 100/100 |

PBT free from any filler caused no strong orientation on the surface thereof, and the surface was easily etched with sulfuric acid. The incorporation of a filler containing a glass fiber in PBT caused reverse orientation, and the roughening rate of the etched surface was higher than that of liquid crystal polyester. This brought about excessive roughening and therefore made it impossible to prepare coated articles and plated articles having good appearances.

The liquid crystal polyesters used in the above Examples were respectively comprised of the following structural units:

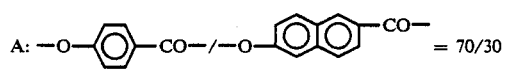

A: = 70/30

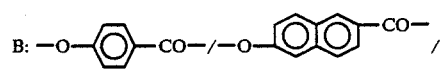

B: /

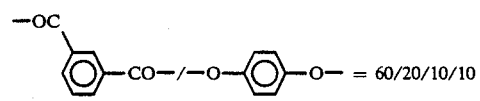

= 60/20/10/10

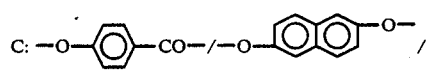

C: /

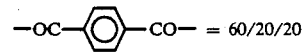

= 60/20/20

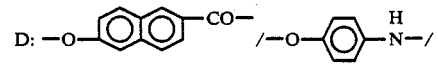

D: /

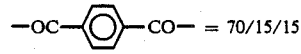

= 70/15/15

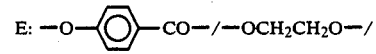

E: /

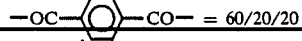

= 60/20/20

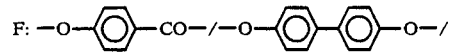

F: /

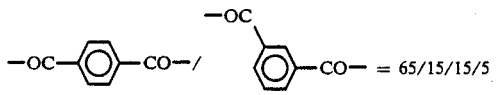

= 65/15/15/5

(The above numerals represent molar ratios.)

We claim:

1. A method of treating the surface of a molded article comprising a liquid crystal polyester resin composition, said composition being composed of a melt-processable polyester capable of forming an anisotropic melt phase and at least one inorganic filler selected from the group consisting of the Group II elements of the periodic table and oxides, sulfates, phosphates, silicates, and carbonates thereof, and elements of aluminum, silicon, tin, lead, antimony, and bismuth and oxides thereof incorporated therein in an amount of 5 to 80% by weight based on the total amount of said molded article composition the method comprising bringing into contact said molded article with an acidic solution containing at least 80% by weight of sulfuric acid for treatment of said molded article.

2. A method of treating the surface of a molded article comprising a liquid crystal polyester resin according to claim 1, wherein said at least one inorganic filler is a finely divided powder having an average particle diameter of 0.01 to 100 μm.

3. A method of treating the surface of a molded article comprising a liquid crystal polyester resin according to claim 1, wherein said molded article composition further comprises a fibrous inorganic material having a diameter of 1 to 30 μm and a length of 5 μm to 1 mm incorporated therein in an amount of 1 to 60% by weight based on the total weight of said molded article composition.

4. A method of treating the surface of a molded article comprising a liquid crystal polyester resin according to claim 2, wherein said molded article composition further comprises a fibrous inorganic material having a diameter of 1 to 30 μm and a length of 5 μm to 1 mm incorporated therein in an amount of 1 to 60% by weight based on the total weight of said molded article composition.

5. A method of treating the surface of a molded article comprising a liquid crystal polyester resin according to claim 1, wherein said melt-processable polyester capable of forming an anisotropic melt phase contains at least 10 mole percent of naphthalene units.

6. A method of treating the surface of a molded article comprising a liquid crystal polyester resin according to claim 5, wherein said naphthalene units of said melt-processable polyester capable of forming an anisotropic melt phase are selected from the group consisting of 6-hydroxy-2-naphthoyl, 2,6-dioxynaphthalene, and 2,6-dicarboxynaphthalene.

7. A method of treating the surface of a molded article comprising a liquid crystal polyester resin according to claim 1, wherein said at least one inorganic filler is incorporated in said melt-processable polyester capable of forming an anisotropic melt phase in an amount of 20 to 70% by weight based on the total amount of said molded article composition.

8. A method of treating the surface of a molded article comprising a liquid crystal polyester resin according to claim 1, wherein said at least one inorganic filler is a phosphate.

9. A method of treating the surface of a molded article comprising a liquid crystal polyester resin according to claim 1, wherein said at least one inorganic filler has an average diameter of 0.1 to 30 μm.

* * * * *